(12) United States Patent
Tousignant et al.

(10) Patent No.: US 9,264,035 B2
(45) Date of Patent: Feb. 16, 2016

(54) MOSFET GATE DRIVING CIRCUIT FOR TRANSITION SOFTENING

(71) Applicant: Honeywell International Inc., Morristown, NJ (US)

(72) Inventors: Daniel Tousignant, St-Jean-sur-Richelieu (CA); Daniel Landry, St-Hyacinthe (CA)

(73) Assignee: Honeywell International Inc., Morris Plains, NJ (US)

( * ) Notice: Subject to any disclaimer, the term of this patent is extended or adjusted under 35 U.S.C. 154(b) by 469 days.

(21) Appl. No.: 13/868,689

(22) Filed: Apr. 23, 2013

(65) Prior Publication Data

US 2014/0312696 A1   Oct. 23, 2014

(51) Int. Cl.

| | |
|---|---|
| *H02H 3/00* | (2006.01) |
| *H03K 17/725* | (2006.01) |
| *H03K 17/16* | (2006.01) |
| *H03K 17/687* | (2006.01) |
| *H03K 17/13* | (2006.01) |

(52) U.S. Cl.
CPC ............. *H03K 17/725* (2013.01); *H03K 17/16* (2013.01); *H03K 17/6871* (2013.01); *H03K 17/133* (2013.01); *H03K 2217/0036* (2013.01); *H03K 2217/0081* (2013.01); *Y10T 307/615* (2015.04)

(58) Field of Classification Search
USPC .......................................... 307/64; 361/8–12
See application file for complete search history.

(56) References Cited

U.S. PATENT DOCUMENTS

| | | |
|---|---|---|
| 4,829,779 A | 5/1989 | Munson et al. |
| 4,969,508 A | 11/1990 | Tate et al. |
| 5,221,877 A * | 6/1993 | Falk .................... H02M 5/2576 307/141 |
| 5,439,441 A | 8/1995 | Grimsley et al. |
| 5,736,795 A | 4/1998 | Zuehlke et al. |
| 5,801,940 A | 9/1998 | Russ et al. |
| 5,903,139 A | 5/1999 | Kompelien |
| 6,205,041 B1 | 3/2001 | Baker |
| 6,288,458 B1 | 9/2001 | Berndt |
| 6,490,174 B1 | 12/2002 | Kompelien |
| 6,619,055 B1 | 9/2003 | Addy |
| 6,622,925 B2 | 9/2003 | Carner et al. |
| 6,635,054 B2 | 10/2003 | Fjeld et al. |
| 6,702,811 B2 | 3/2004 | Stewart et al. |
| 6,771,996 B2 | 8/2004 | Bowe et al. |

(Continued)

OTHER PUBLICATIONS

Cirrus Logic, Inc., "CS1501 Digital Power Factor Correction Control IC," 16 pages, 2012.

(Continued)

*Primary Examiner* — Danny Nguyen
(74) *Attorney, Agent, or Firm* — Seager, Tufte & Wickhem LLP

(57) ABSTRACT

A power supply unit for use with thermostats or other like devices requiring power. A power supply unit may be designed to keep electromagnetic interference emissions at a minimum, particularly at a level that does not violate governmental regulations. A unit may be designed so that there is enough power for a triggering a switch at about a cross over point of a waveform of input power to the unit. Power for triggering may come from a storage source rather than line power to reduce emissions on the power line. Power for the storage source may be provided with power stealing. Power stealing may require switching transistors which can generate emissions. Gate signals to the transistors may be especially shaped to keep emissions from transistor switching at a minimum.

20 Claims, 21 Drawing Sheets

(56) References Cited

U.S. PATENT DOCUMENTS

| | | |
|---|---|---|
| 6,808,524 B2 | 10/2004 | Lopath et al. |
| 6,893,438 B2 | 5/2005 | Hall et al. |
| 7,133,748 B2 | 11/2006 | Robinson |
| 7,476,988 B2 | 1/2009 | Mulhouse et al. |
| 7,574,283 B2 | 8/2009 | Wang et al. |
| 7,595,613 B2 | 9/2009 | Thompson et al. |
| 7,600,694 B2 | 10/2009 | Helt et al. |
| 7,642,674 B2 | 1/2010 | Mulhouse et al. |
| 7,692,559 B2 | 4/2010 | Face et al. |
| 7,837,676 B2 | 11/2010 | Sinelnikov et al. |
| 7,838,803 B1 | 11/2010 | Rosen |
| 7,859,815 B2 | 12/2010 | Black et al. |
| 7,992,794 B2 | 8/2011 | Leen et al. |
| 8,216,216 B2 | 7/2012 | Warnking et al. |
| 8,892,223 B2 | 11/2014 | Leen et al. |
| 9,071,145 B2 | 6/2015 | Simard et al. |
| 2002/0181251 A1 | 12/2002 | Kompelien |
| 2003/0040279 A1 | 2/2003 | Ballweg |
| 2003/0060821 A1 | 3/2003 | Hall et al. |
| 2003/0073891 A1 | 4/2003 | Chen et al. |
| 2006/0112700 A1 | 6/2006 | Choi et al. |
| 2007/0114848 A1 | 5/2007 | Mulhouse et al. |
| 2007/0114963 A1 * | 5/2007 | Steiner .................. H02P 1/24 318/772 |
| 2007/0115135 A1 | 5/2007 | Mulhouse et al. |
| 2007/0119961 A1 | 5/2007 | Kaiser |
| 2007/0163844 A1 | 7/2007 | Jahkonen |
| 2007/0241203 A1 | 10/2007 | Wagner et al. |
| 2007/0290924 A1 | 12/2007 | McCoy |
| 2007/0296260 A1 | 12/2007 | Stossel |
| 2009/0154206 A1 | 6/2009 | Fouquet et al. |
| 2009/0167265 A1 | 7/2009 | Vanderzon |
| 2009/0206657 A1 | 8/2009 | Vuk et al. |
| 2010/0026379 A1 | 2/2010 | Simard et al. |
| 2010/0225267 A1 | 9/2010 | Elhalis |
| 2010/0314458 A1 | 12/2010 | Votaw et al. |
| 2012/0235490 A1 | 9/2012 | Lee et al. |
| 2013/0213952 A1 | 8/2013 | Boutin et al. |
| 2015/0001929 A1 | 1/2015 | Juntunen et al. |
| 2015/0001930 A1 | 1/2015 | Juntunen et al. |
| 2015/0002165 A1 | 1/2015 | Juntunen et al. |

OTHER PUBLICATIONS

U.S. Appl. No. 13/868,716, filed Apr. 23, 2013.
U.S. Appl. No. 13/868,754, filed Apr. 23, 2013.
Hendon Semiconductors, "OM1894 Dual Sensing Precision Triac Control," Product Specification, Rev. 2.0, 21 pages, Apr. 19, 2007.
Signetics Linear Products, "TDA1024 Zero Crossing Triac Trigger," Product Specification, 14 pages, Sep. 1985.
International Search Report for Corresponding Application No. PCT/US2014/044229, dated Oct. 13, 2014.
U.S. Appl. No. 14/300,232, filed Jun. 9, 2014.
U.S. Appl. No. 14/309,431, filed Jun. 19, 2014.
U.S. Appl. No. 14/309,553, filed Jun. 19, 2014.
U.S. Appl. No. 14/329,357, filed Jul. 11, 2014.
Honeywell, "System Installation Guide: Important Instructions," Honeywell International Inc., 25 pages, 2011.
http://www.dimplex.com/en/home_heating/linear_convector_baseboards/products/lpc_series/linear_proportional_convector, Dimplex Coporation, "Linear Convector LPC Series," 2 pages, May 2011.
http://www.enernetcorp.com/, Enernet Corporation, "Wireless Temperature Control" 1 page, 2011.
http://www.enernetcorp.com/t9000-wireless-thermostat.html, Enernet Corporation, "T9000 Series Wireless Fan Coil Thermostat," Product Brochure, 2 pages, 2011.
http://www.enocean-alliance.org/en/products/regulvar_rw-ssr347-15a/, Regulvar Corporation, "RW-SSR347-15A, Relais sans fil à semi-conducteurs" 3 pages, Aug. 8, 2009.
http://www.enocean-alliance.org/en/products/regulvar_rw-tp01/, Regulvar Corporation, "RW-TP01, Capteur de température sans fil" 3 pages, Aug. 9, 2009.
http://www.forwardthinking.honeywell.com/products/wireless/focus_pro/focus_pro_feature.html, Honeywell Corporation, "Wireless FocusPRO® pages", 2 pages, 2011.

* cited by examiner

MOSFET GATE DRIVING CIRCUIT FOR TRANSITION SOFTENING

BACKGROUND

The present disclosure pertains to thermostats and particularly to various kinds of power supplies for thermostats.

SUMMARY

The disclosure reveals a power supply unit for use with thermostats or other like devices requiring power. A power supply unit may be designed to keep electromagnetic interference emissions at a minimum, particularly at a level that does not violate governmental regulations. A unit may be designed so that there is enough power for triggering a switch at about a cross over point of a waveform of input power to the unit. Power for triggering may come from a storage source rather than line power to reduce emissions on the power line. Power for the storage source may be provided with power stealing. Power stealing may require switching transistors which can generate emissions. Gate signals to the transistors may be especially shaped to keep emissions from transistor switching at a minimum.

DESCRIPTION

The present system and approach may incorporate one or more processors, computers, controllers, user interfaces, wireless and/or wire connections, and/or the like, in an implementation described and/or shown herein.

This description may provide one or more illustrative and specific examples or ways of implementing the present system and approach. There may be numerous other examples or ways of implementing the system and approach.

Figure 1:
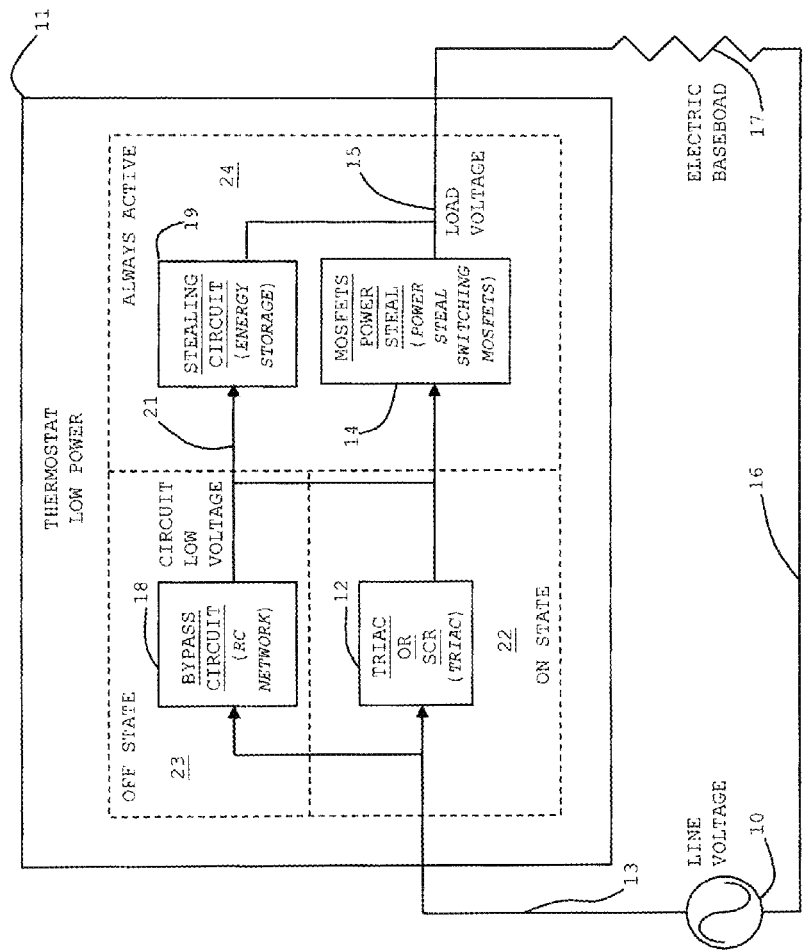
FIGS. 1 and 2 are diagrams of a thermostat power supply unit for low and high power, respectively.

A triac 12 or bypass circuit 18 and a MOSFET power steal 14 combination may be noted (FIG. 1). Two-wire devices may need power stealing functionality to supply their electronics, and conditioned triac triggering functionality to comply with FCC title 47 part 15 sub B, EMI conducted emissions regulations.

The triggering functionality need may involve using active triggering which in turn requires high power in order to deliver consistent and reliable performance at a triac gate. Active triggering may be defined as the ability to store energy and supply it to trigger the triac 12 near zero-crossing when a power line's energy is not sufficient.

One way of supplying high power to the electronics may be a use of a serial MOSFETs power stealing approach. Another approach may be to delay the triac trigger, but this approach might not comply with FCC regulations.

Current transformers may also be used but they might not be able, in the load range and size available, to supply the high power requirement for the active triac triggering and thus not comply with FCC regulations.

A thermostat device may have two states. First, the ON state 22 (FIG. 1) is when a heating demand is ON while the entire device is operating with triac 12 ON. Second, the OFF state 23 may be when the heating demand is OFF while the device remains in operation with triac 12 OFF.

A triac 12 and MOSFET 14 combination for the ON state 22 does not appear to have been done or been used in a thermostat.

For the OFF state 23, a triac bypass circuit 18 may be needed to supply power to thermostat electronics. Depending on power requirements, bypass circuit 18 may be an AC-DC converter for high power such as for RF applications, an RC (resistor-capacitor) network for moderate or low power, or an R (resistor) only network for rather low power.

Virtually any kind of a bypass supply approach may be used because the triac triggering approach can be independent of the bypass supply approach which is not necessarily the case in a related art OFF state supply approach of an R network with a current transformer or triac trigger being delayed.

The present thermostat topology may be a key combination for FCC compliance. It may provide a solution for in-line line-volt thermostats.

Bypass circuit 18 may be scaled to accommodate a full range of thermostats' energy requirements such as RF energy hungry applications (e.g., wifi, zigbee, RF host modules, and so forth), RF moderate or low energy applications (e.g., RF client modules, and so forth), and the usual programmable or non-programmable thermostats. Also, the triac switch component 12 may be changed to an SCR (thyristor) or a relay with minor adjustments to circuitry.

Figure 3:
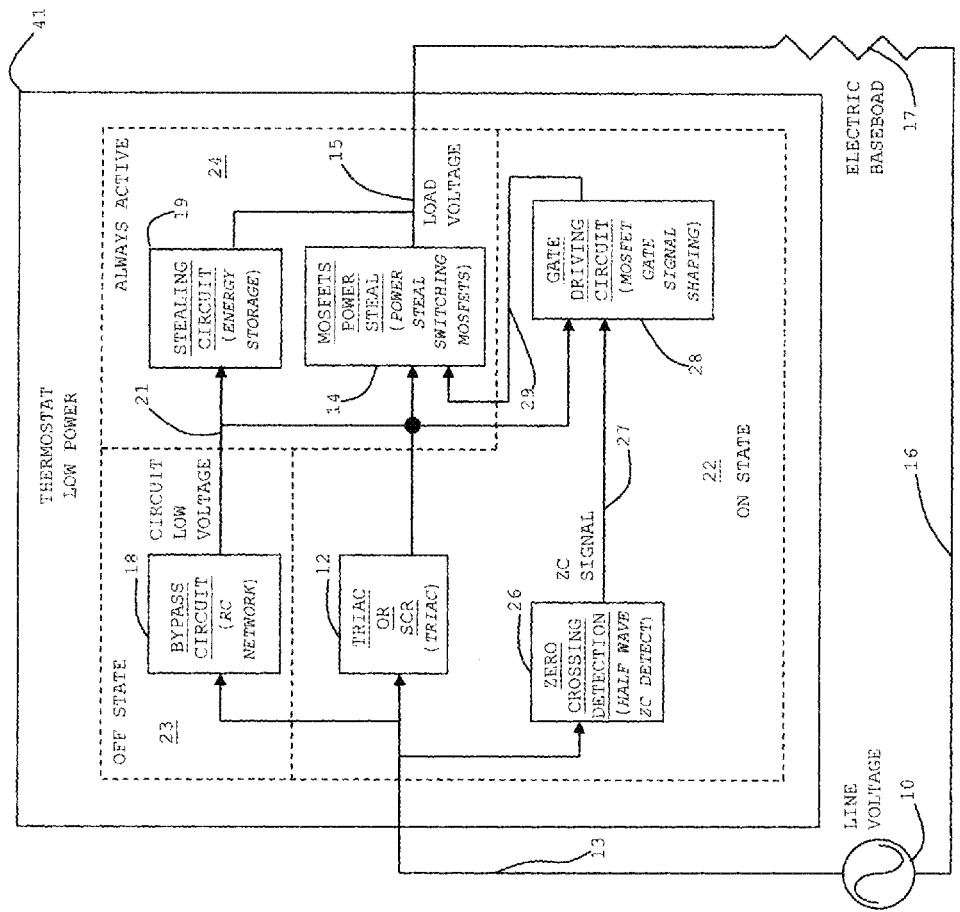
FIGS. 3 and 4 are diagrams of a thermostat power supply having a gate driving circuit for low and high power, respectively.
Figure 4:
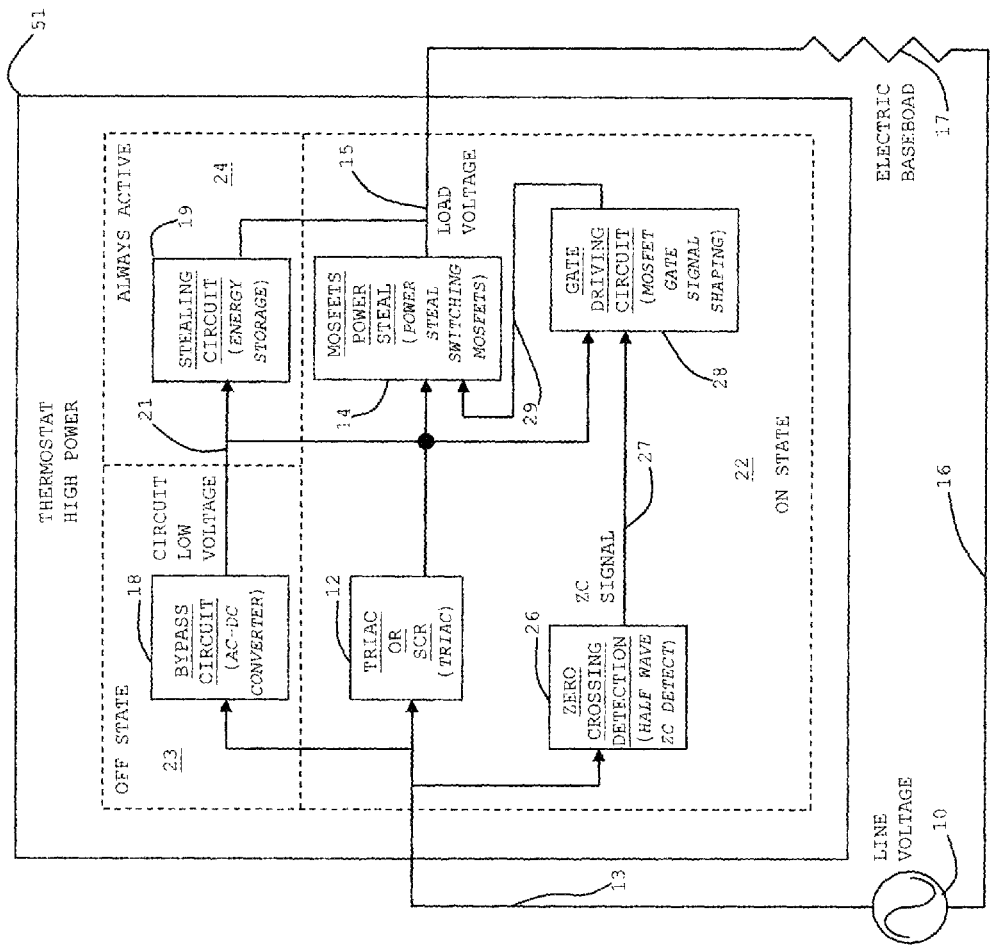

A MOSFET gate driving circuit 28 for transition softening may be noted in FIGS. 3 and 4. Two-wire devices may need power stealing functionality to supply their electronics. When this power stealing is done with serial MOSFETs 14, they may need to be triggered in such a way that turning MOSFETs ON/OFF complies with FCC regulations.

By having a circuit 28 that may control the rate of charge and discharge of the MOSFET gates, the gate switching behaviors may be controlled, and thus control the current and voltage transition generated by the power steal module 14. Such control may enable one to reduce EMI conducted emissions.

A circuit 28 may do a positive zero crossing power steal and use two current limiting devices to control the rate of charge and discharge of the MOSFET gates, respectively. The circuit may also use latching circuitry enabled by a voltage level detector, to keep the MOSFETs state until the next power steal.

Some approaches may use a current transformer or the triac itself to do the power steal. In both cases, the triac transition cannot necessarily be controlled in such a way that will comply with FCC regulations. The MOSFET transition may need to be smoothed. The present circuit may soften a MOSFET transition. In this case, one may use the circuit to reduce EMI conducted emissions produced by a current zero crossing power stealing circuit using MOSFETs.

An active triac 12 may be noted. In order to comply with FCC emission regulations, triac triggering may need to be controlled in such a way that EMI noise emitted on the AC main lines is kept low. This functionality may be accomplished by an active triggering.

Active triac triggering may be done with the present approach in thermostats. The approach may result in reduced EMI conducted emissions generated by triac 12. Active triggering may be defined as the ability to store energy and supply the energy to trigger triac 12 near zero-crossing when power line's energy is not sufficient. Previously, passive triggering may have been used, which meant triggering triac 12 with energy directly from a power line 13.

Active triac triggering may be done from a continuous or pulsed DC source. Triac 12 may work in quadrants II and III. The triggering may also be done from an alternating continuous or pulsed DC source. Triac 12 may work in quadrants I and III.

Figure 5:
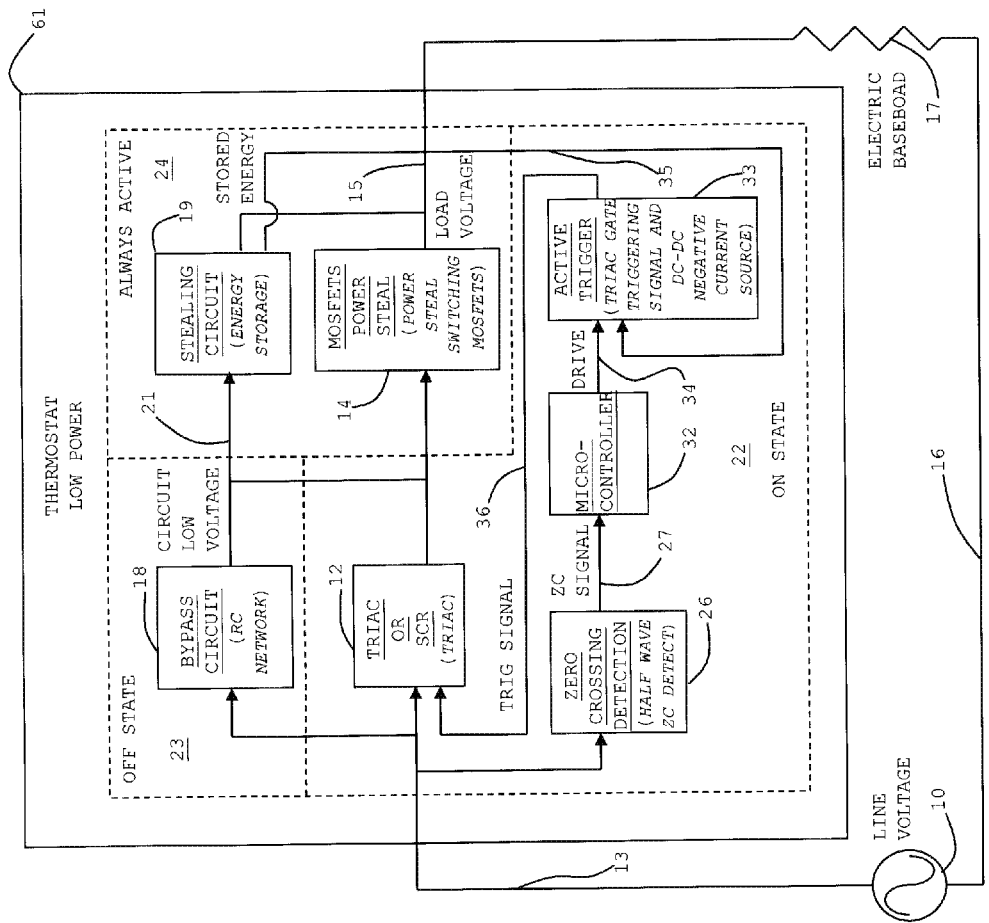
FIGS. 5 and 6 are diagrams of a thermostat power supply having an active trigger circuit for low and high power, respectively.
Figure 6:
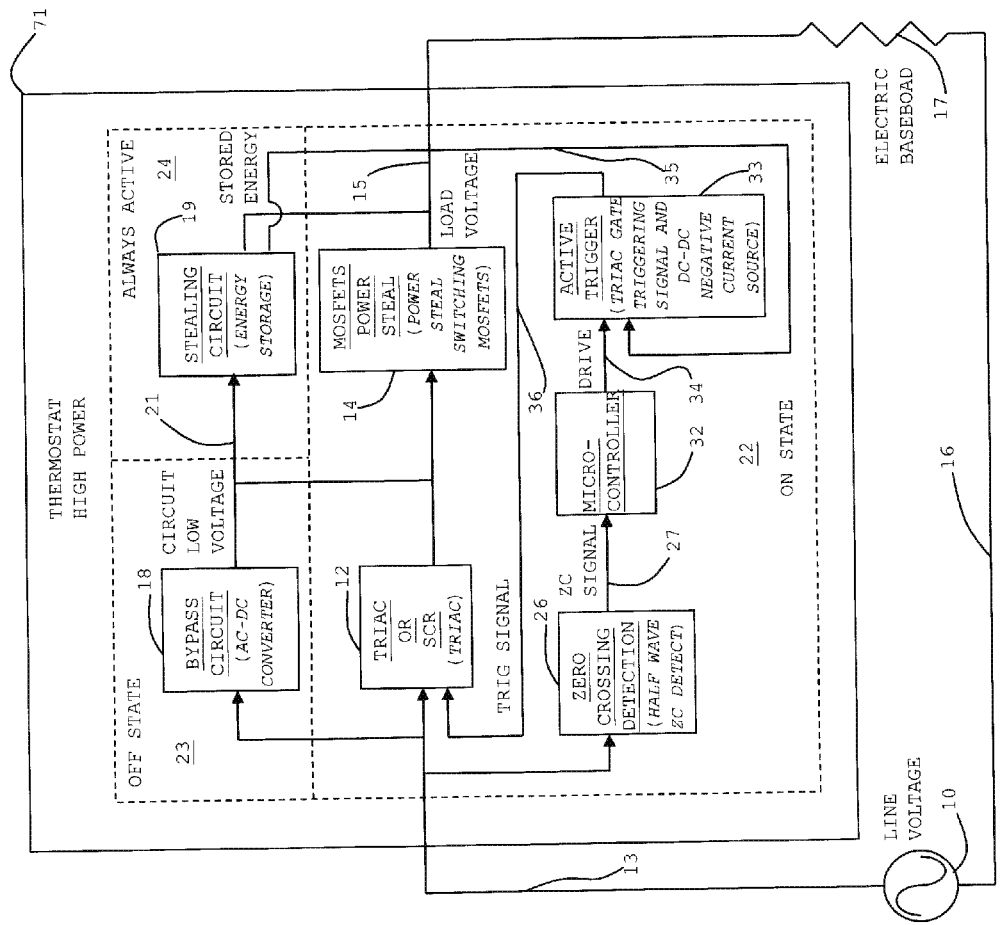
Figure 7:
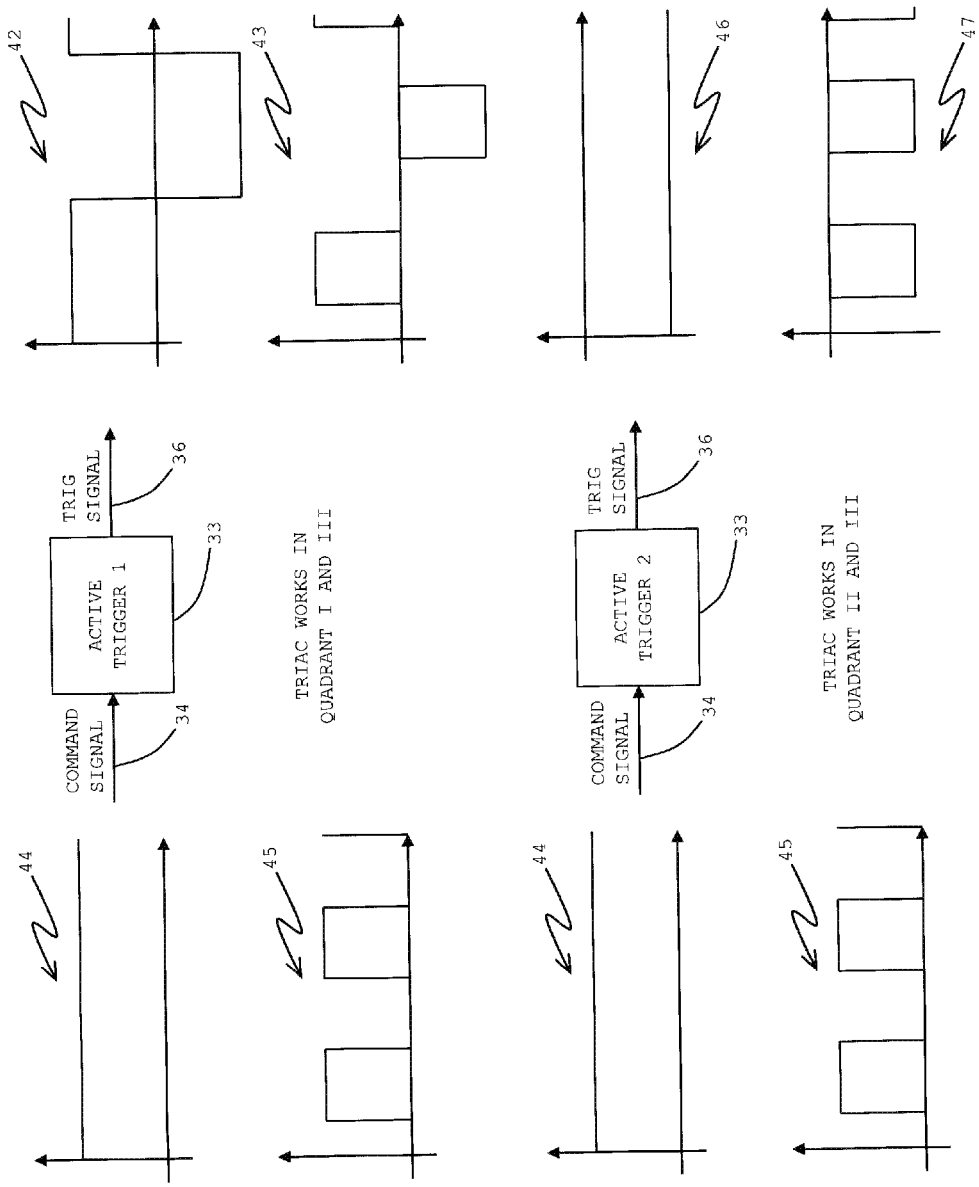
FIG. 7 is a diagram of various waveforms applicable to the active trigger circuit.

To activate the circuit, a command signal or drive 34 may be applied at an input of an active trigger circuit 33 as illustrated in FIGS. 5-7. Command signal 34 may be synchronized with the current zero crossing from AC line 13. The shape of an active triggering signal 36 may depend on the shape of the input command signal 34 and on the logic of active trigger circuit 33.

For triac quadrants I and III, the practice may be to alternate the trig 36 between positive and negative signals as shown by the signal profiles 42 and 43. Command signal 34 may be continuous or pulsed as shown by signal profiles 44 and 45, respectively.

For triac quadrants II and III, the practice may be to provide a negative trig signal 36 as shown by signal profiles 46 and 47. The command signal 34 to active trigger circuit 33 may be continuous or pulsed as shown by signal profiles 44 and 45, respectively.

A choice of active triggering circuits may depend on the thermostat complexity combined with the energy consumption needed. An alternating DC source may be more complex. Pulse triggering may consume less power. The noted active triggering approaches may reduce EMI conducted emissions produced by the triac.

FIG. 1 is a diagram of a power supply unit 11 for a thermostat needing low power. Unit 11 may have a triac or SCR module 12 having an input connected to a line voltage 13. Module 12 may have a relay or some triggerable switch. A MOSFET power steal module 14 may have an input connected to an output of module 12 via line 21. An output of module 14 may be connected to a load voltage line 15. A source 10 may provide AC power on line voltage 13 and line 16. Line 16 may be connected to one end of an electric baseboard 17. Another end of baseboard 17 may be connected to line 15.

A bypass circuit 18 may have an input connected to line voltage 13. An output of circuit 18 may be a circuit low voltage line 21 connected to an input of stealing circuit 19. Unit 11 layout may be divided into three areas including an on state area 22, an off state area 23, and an always active area 24. Modules 12 may be in area 22. Circuit 18 may be in area 23, and circuit 19 and 14 may be in area 24. A component of the triac or SCR module 12 may be a triac. Components of the MOSFET power steal module 14 may incorporate power steal switching MOSFETs. A component of bypass circuit 18 may be an RC network. A component of stealing circuit 19 may be for energy storage.

Figure 2:
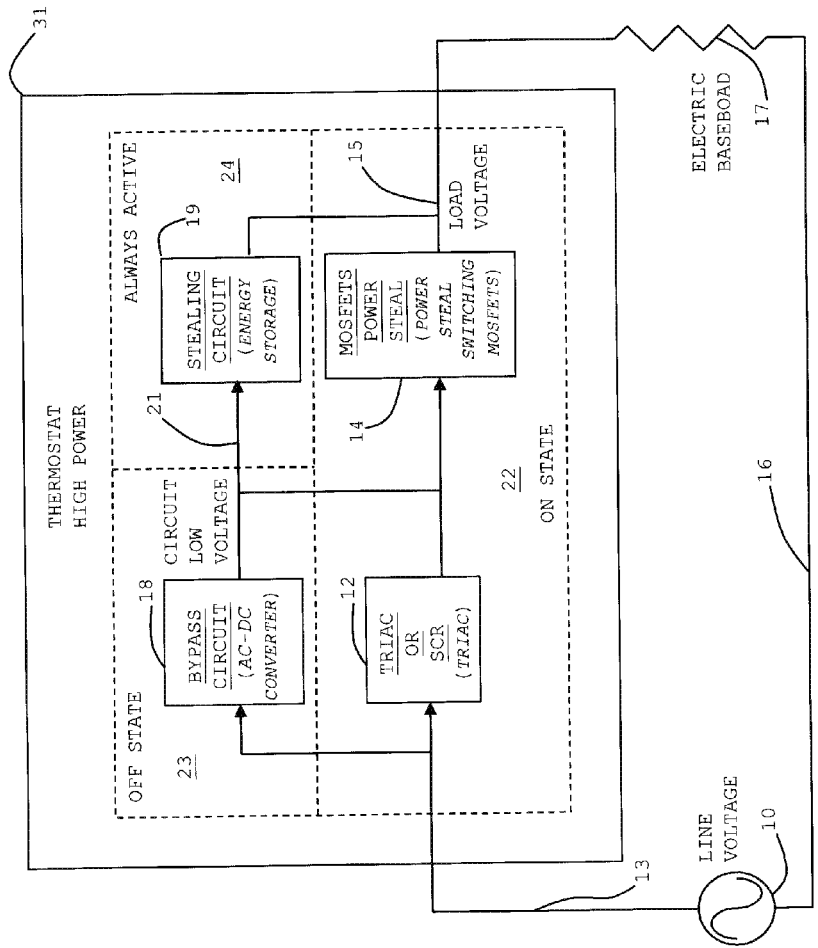

FIG. 2 is a diagram of a power supply unit 31 for a thermostat needing more power like RF applications. Unit 31 may be similar to unit 11 of FIG. 1 except that the component of circuit 18 may instead be an AC-DC converter and the MOSFET power steal module is in the area 22.

FIG. 3 is a diagram of a power supply unit 41 for a thermostat needing low power. Unit 41 may be similar to unit 11 of FIG. 1 except that unit 41 may incorporate a zero crossing (ZC) detection module 26 in area 22. An input of module 26 may be connected to line voltage 13. An output from module 26 may be a ZC signal on a line 27 to an input of a gate driving circuit 28. Also to an input of circuit 28 may be the circuit low voltage on line 21. An output from circuit 28 may go to an input of module 14 via a line 29. Module 26 may incorporate a half wave ZC detect component. Circuit 28 may incorporate a MOSFET gate signal shaping component.

FIG. 4 is a diagram of a power supply unit 51 for a thermostat needing high power for RF applications. Unit 51 may be similar to unit 41 of FIG. 3 except that the component of circuit 18 may instead be an AC-DC converter and the MOSFET power steal module is in the area 22.

FIG. 5 is a diagram of a power supply unit 61 for a thermostat using low power. Unit 61 may be similar to unit 41 of FIG. 3 except that unit 61 does not necessarily incorporate the gate driving circuit 28 and may incorporate a microcontroller 32 and an active trigger module 33 in area 22. ZC signal may go on line 27 to an input of microcontroller 32. A drive signal on a line 34 may go to an input of active trigger module 33. Stored energy may proceed from an output of circuit 19 to an input of module 33 via a line 35. A trig signal from an output of module 33 may proceed along a line 36 to an input of module 12.

FIG. 6 is a diagram of a power supply unit 71 for a thermostat needing high power. Unit 71 may be similar to unit 61 of FIG. 5 except that the component of circuit 18 may be an AC-DC converter and the MOSFET power steal module is in the area 22. Units 61 and 71 may be expanded to incorporate the gate driving circuit 28 arrangement of units 41 and 51.

Figure 8:
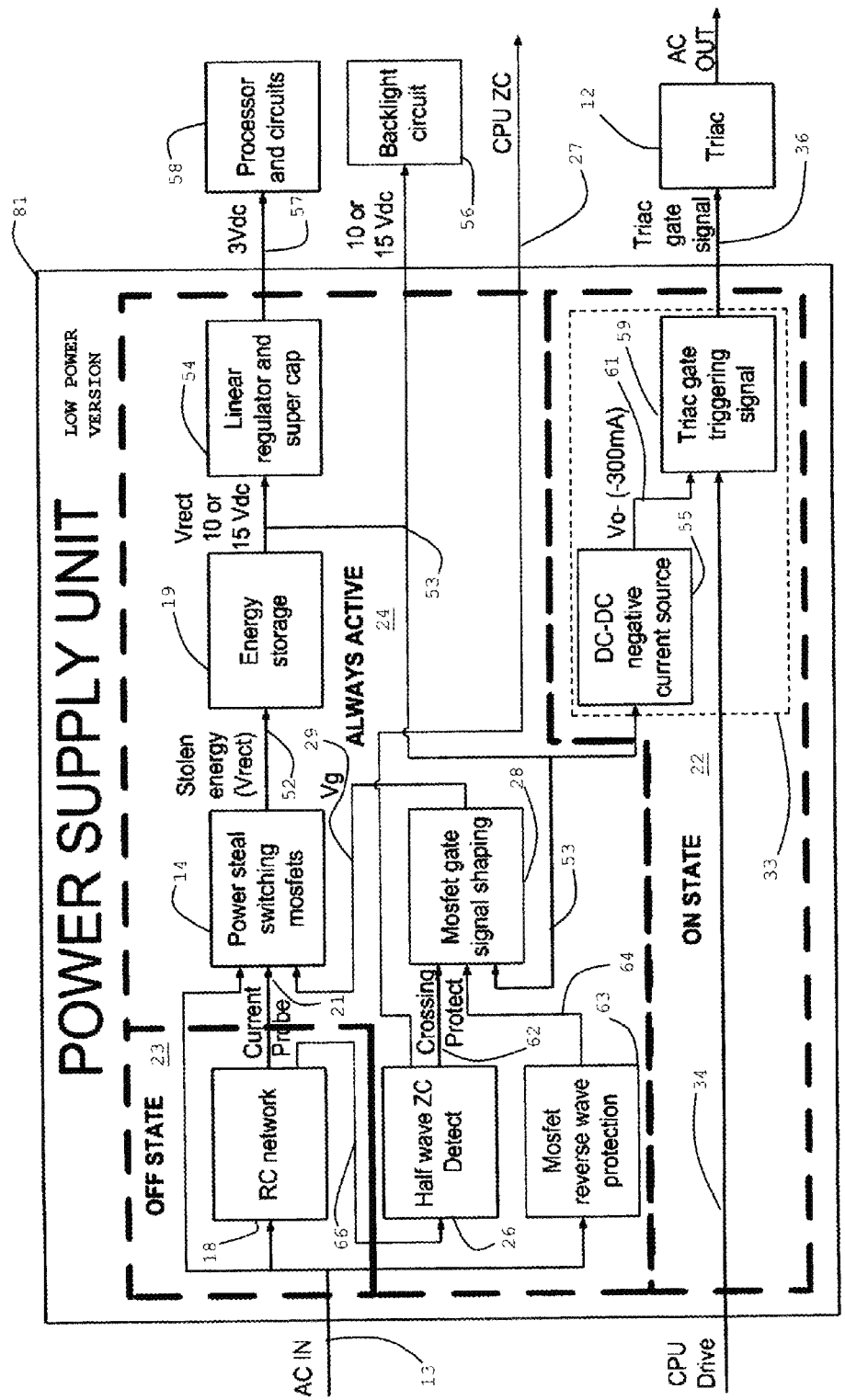
FIGS. 8 and 9 are more detailed diagrams of the thermostat power supply for low and high power, respectively.

FIG. 8 is a diagram of a low power version of a power supply unit 81 having resemblances to units 11, 31, 41, 51, 61 and 71 of FIGS. 1-6, respectively. An RC network of a bypass circuit 18 may output current along connection 21 to power stealing switching MOSFETs. Power steal module 14 along connection 52 may provide stolen energy (Vrect) to energy storage module or stealing circuit 19. A connection 53 may provide energy at a level (Vrect) 10 or 15 Vdc to a linear regulator and super cap circuit 54, the gate driving circuit of MOSFET signal shaping circuit 28, a DC-DC negative current source 55 of active trigger module 33, and a backlight circuit 56.

Regulator and super cap circuit 54 may provide 3 Vdc power along connection 57 to a processor and other circuits 58. Zero crossing detector 26 having an input along connection 66 from bypass circuit 18 and a half wave ZC detect of detector 26 may provide a zero crossing signal along a connection 27 to a CPU 32. A drive signal from CPU 32 along a connection 34 may go to a triac gate triggering signal circuit 59 of active trigger module 33. The DC-DC negative current source 55 may provide energy at Vo with a current of a negative 300 mA along a connection 61 to the triac gate triggering signal circuit 59.

A zero crossing signal may go on connection 62 from detector 26 to the gate signal shaping circuit 28. A MOSFET reverse wave protection circuit 63 may have an input from line 13 and a protect signal output on connection 64 to circuit 28.

Figure 9:
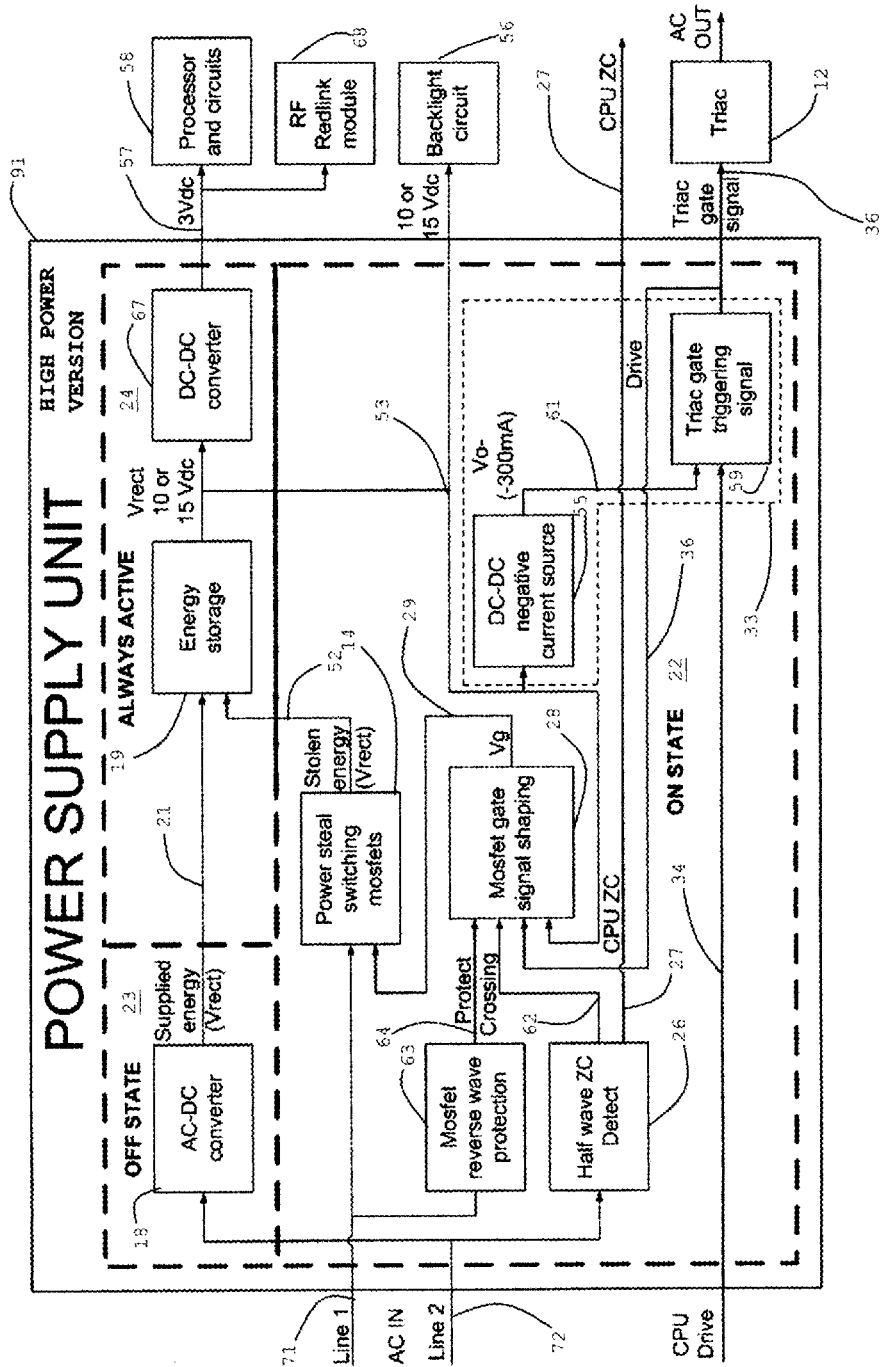

FIG. 9 is a diagram of a high power version of a power supply unit 91 which appears similar to unit 81 of FIG. 8. Line power 13 of other units may be presented as two lines 1 and 2 at unit 91. Power 71 of line 1 may be provided to power steal module 14 and MOSFET reverse wave protection circuit 63. Power 72 of line 2 may be provided to bypass circuit 18 and half wave ZC detector of circuit 26.

In contrast to unit 81, bypass circuit 18 of unit 91 may have an AC-DC converter in lieu of an RC network. AC-DC converter may supply energy (Vrect) on connection 21 to energy storage module 19. In lieu of linear regulator and super cap circuit 54, unit 91 may have a DC-DC converter 67. An output of converter 67 may be 3 Vdc to processor and circuits 58 and RF Redlink™ module 68. RF Redlink™ module 68 may also be a Wifi module or any other RF protocol. Another distinction between units 81 and 91 may be connection 36 being extended as an input to gate signal shaping circuit 28.

Figure 10:
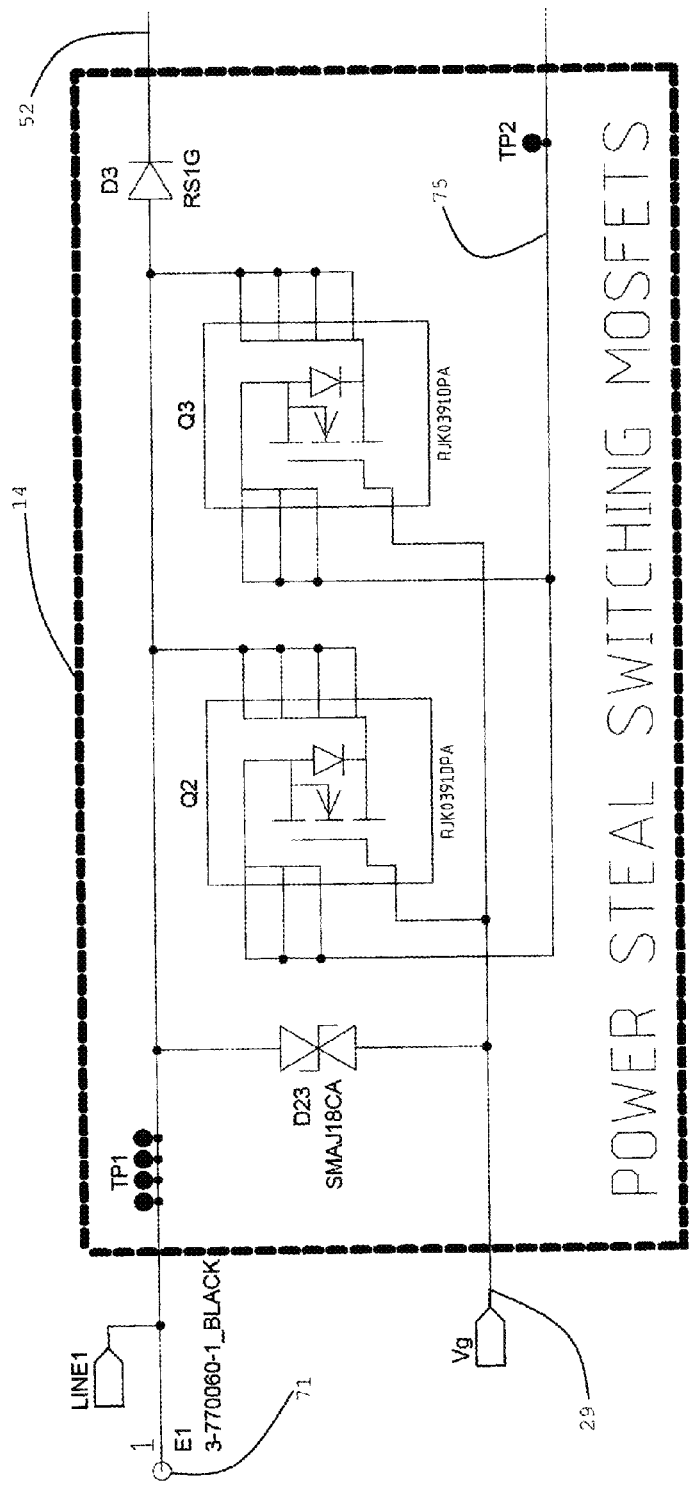
FIG. 10 is a diagram of a power steal switching transistors circuit.
Figure 11:
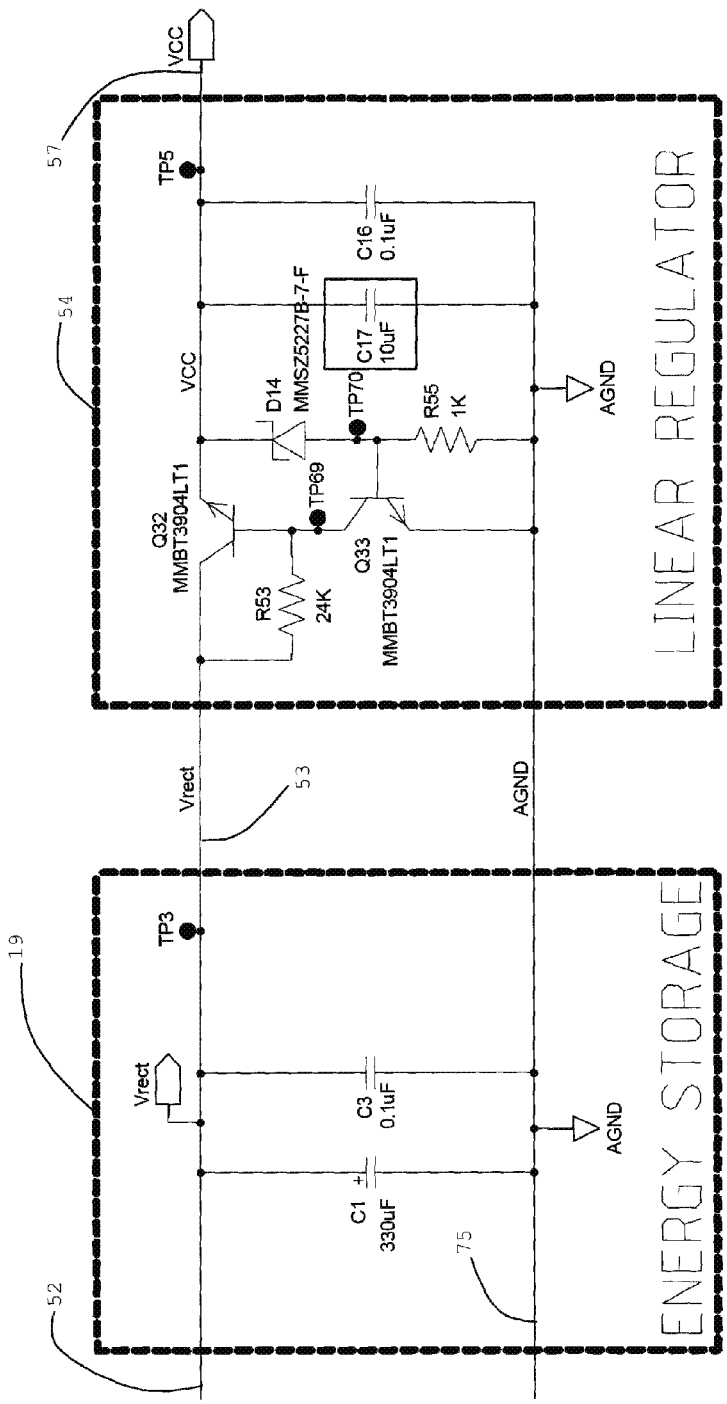
FIG. 11 is a diagram of an energy storage module and a linear regulator.

FIGS. 10-17 are diagrams for circuitry of various parts of unit 81. FIG. 10 is a diagram of power steal switching MOSFETs 14 showing a line 1, which may be of power 13 and be designated as line 71. Also, there may be connections 29 and 52, and ground terminal 75. FIG. 11 is a diagram of energy storage module 19 and linear regulator 54. Also shown are connections 52, 53 and 57, and ground terminal 75.

Figure 12:
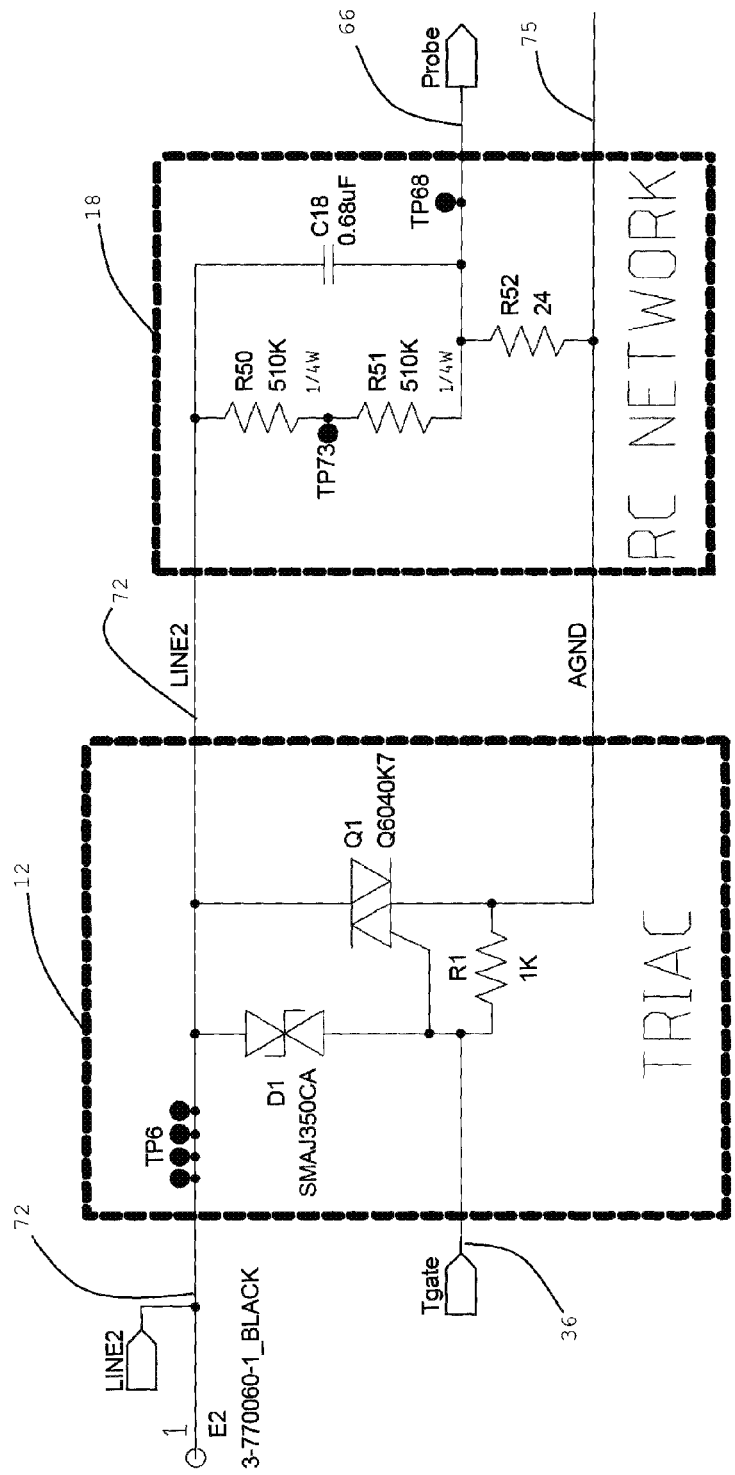
FIG. 12 is a diagram of a triac and an RC network.
Figure 13:
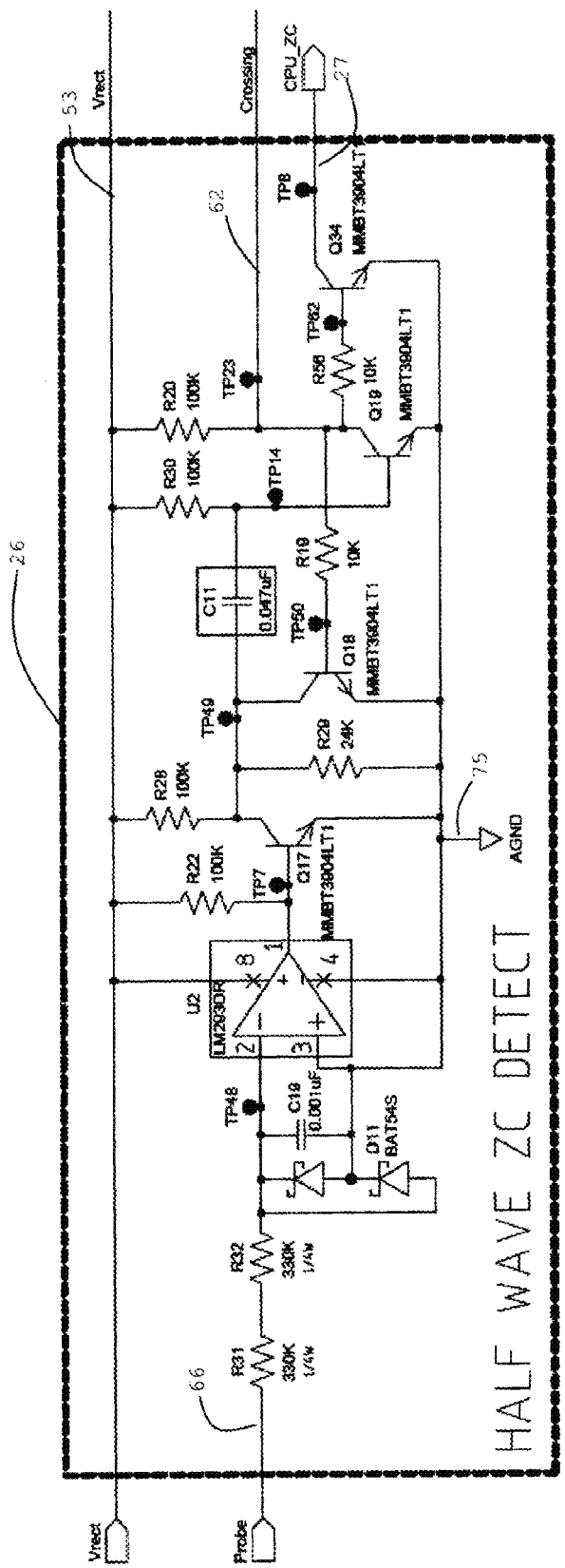
FIG. 13 is a diagram of a half wave zero crossing detect circuit.

FIG. 12 is a diagram of a triac circuit 12 and an RC network of bypass circuit 18 along with line 2, which may be of power 13 and designated as line 72. Also there may be connections 66 and 36, and ground terminal 75. FIG. 13 is a diagram of a half wave ZC detect circuit 26 along with connections Vrect 53, a connection 66, crossing connection 62, CPU ZC connection 27, and ground terminal 75.

Figure 14:
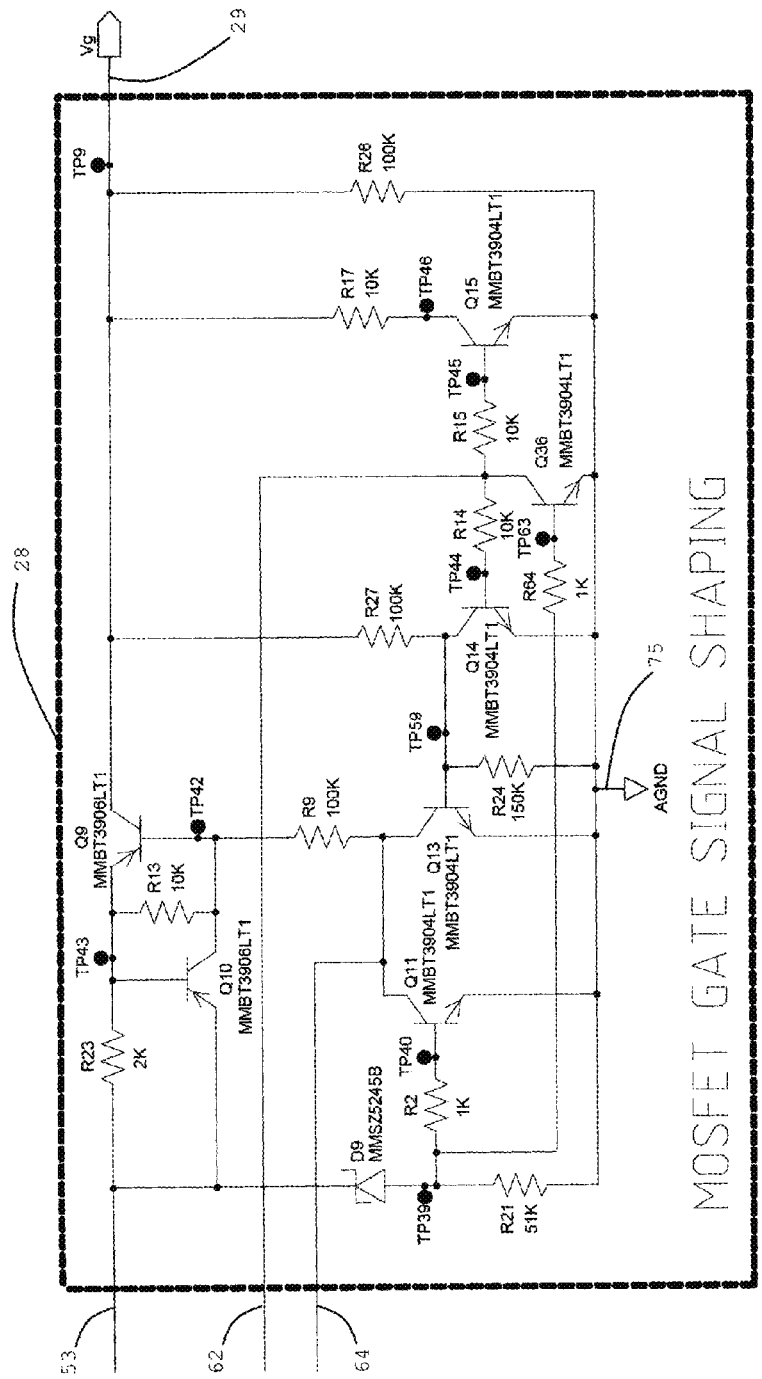
FIG. 14 is a diagram of a gate signal shaping circuit.
Figure 15:
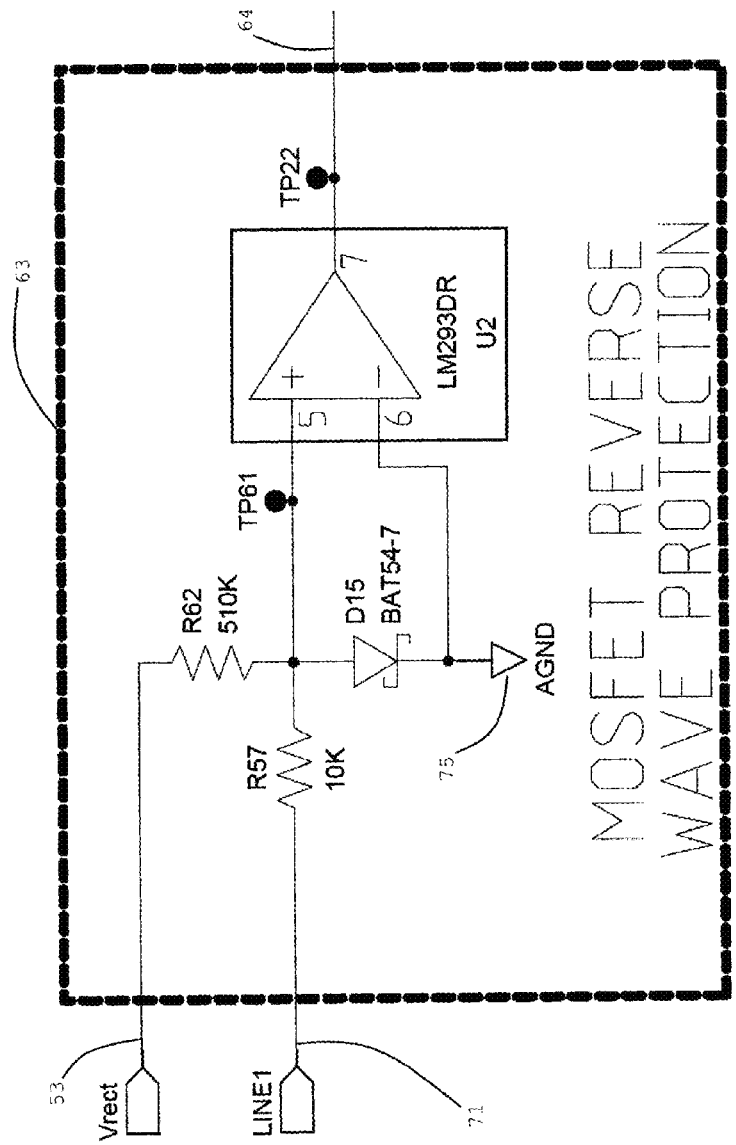
FIG. 15 is a diagram of a transistor reverse wave protection circuit.

FIG. 14 is a diagram of the gate signal shaping circuit 28. Also shown are connections 53, 62, 64 and 29, and ground terminal 75. FIG. 15 is a diagram of a MOSFET reverse wave protection circuit 63 showing connection 53, line 71, connection 64 for the protect signal, and a ground terminal 75.

Figure 16:
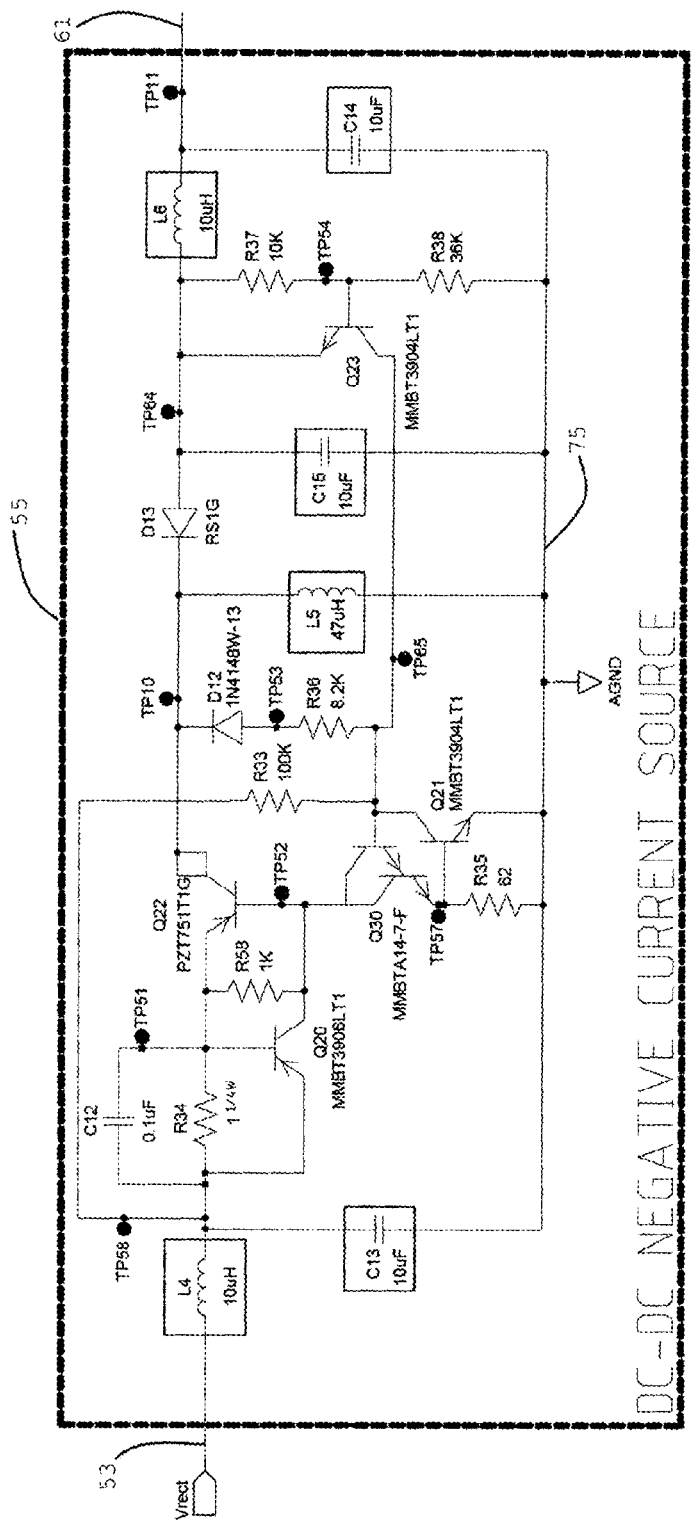
FIG. 16 is a diagram of a negative current source.
Figure 17:
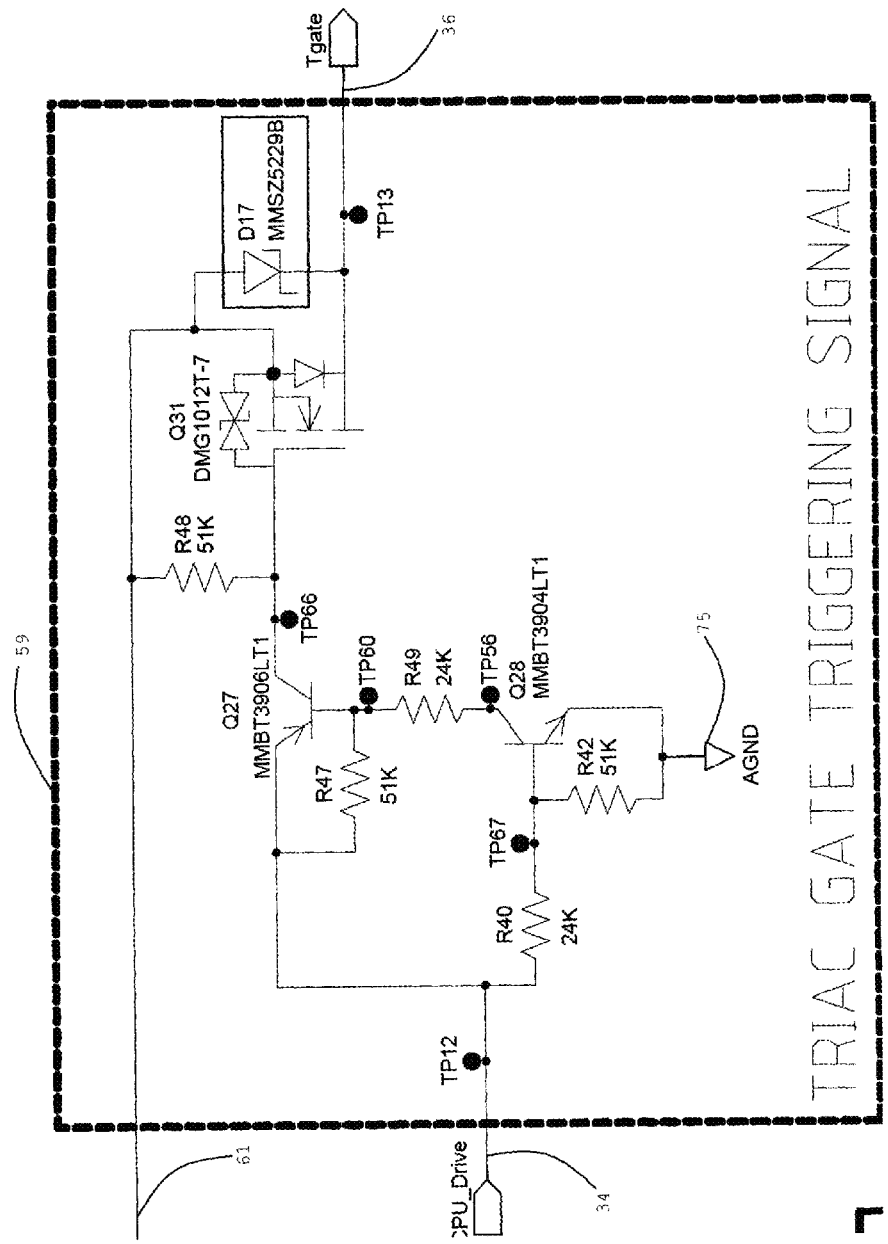
FIG. 17 is a diagram of triac gate triggering signal source.

FIG. 16 is a diagram of the DC-DC negative current source 55 having an output on connection 61, a voltage connection 53 and a ground connection 75. FIG. 17 is a diagram of triac gate triggering signal circuit 59 showing a connection 61, a drive connection 34, a triac gate signal connection 36 and a ground connection 75.

Figure 18:
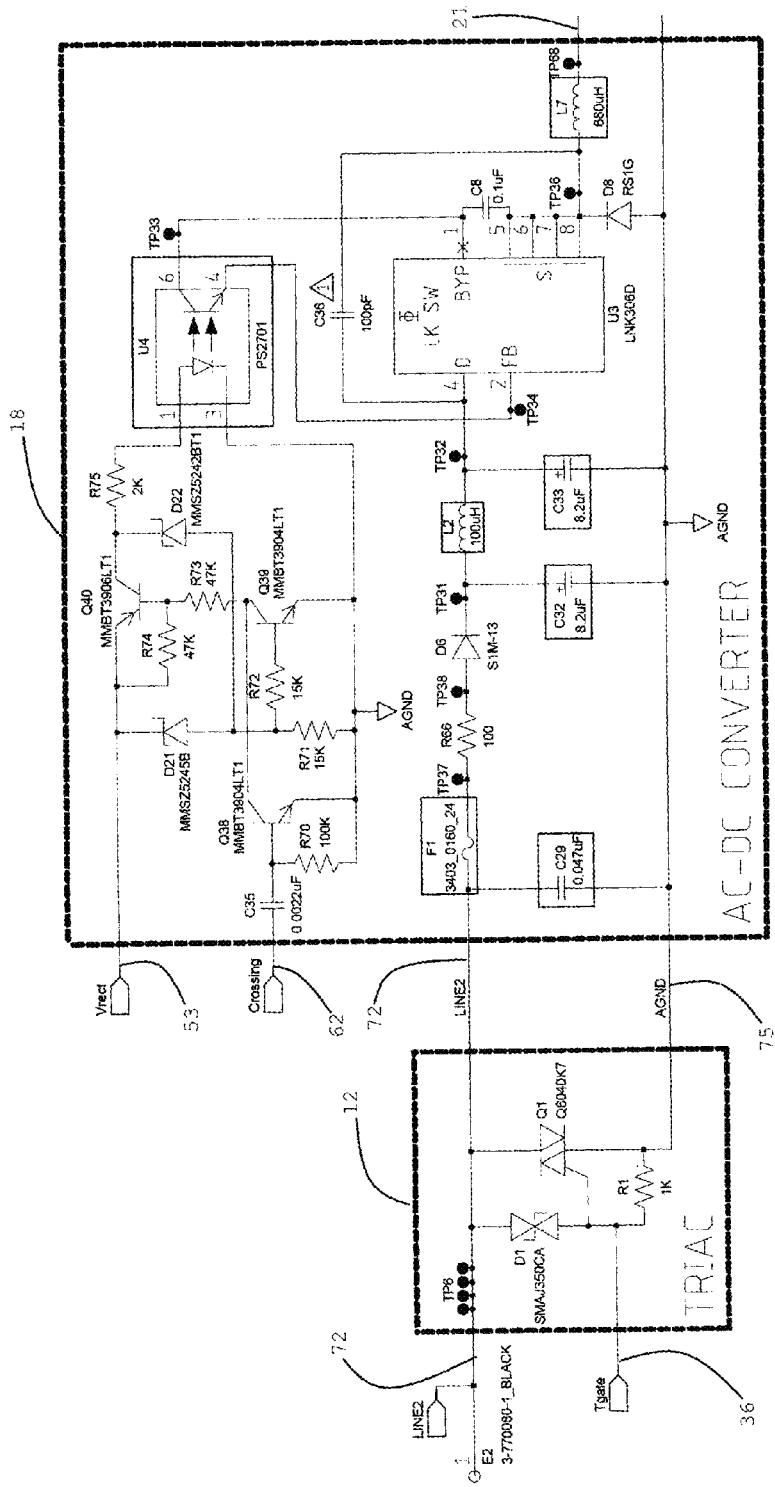
FIG. 18 is a diagram of triac and AC-DC converter.
Figure 19:
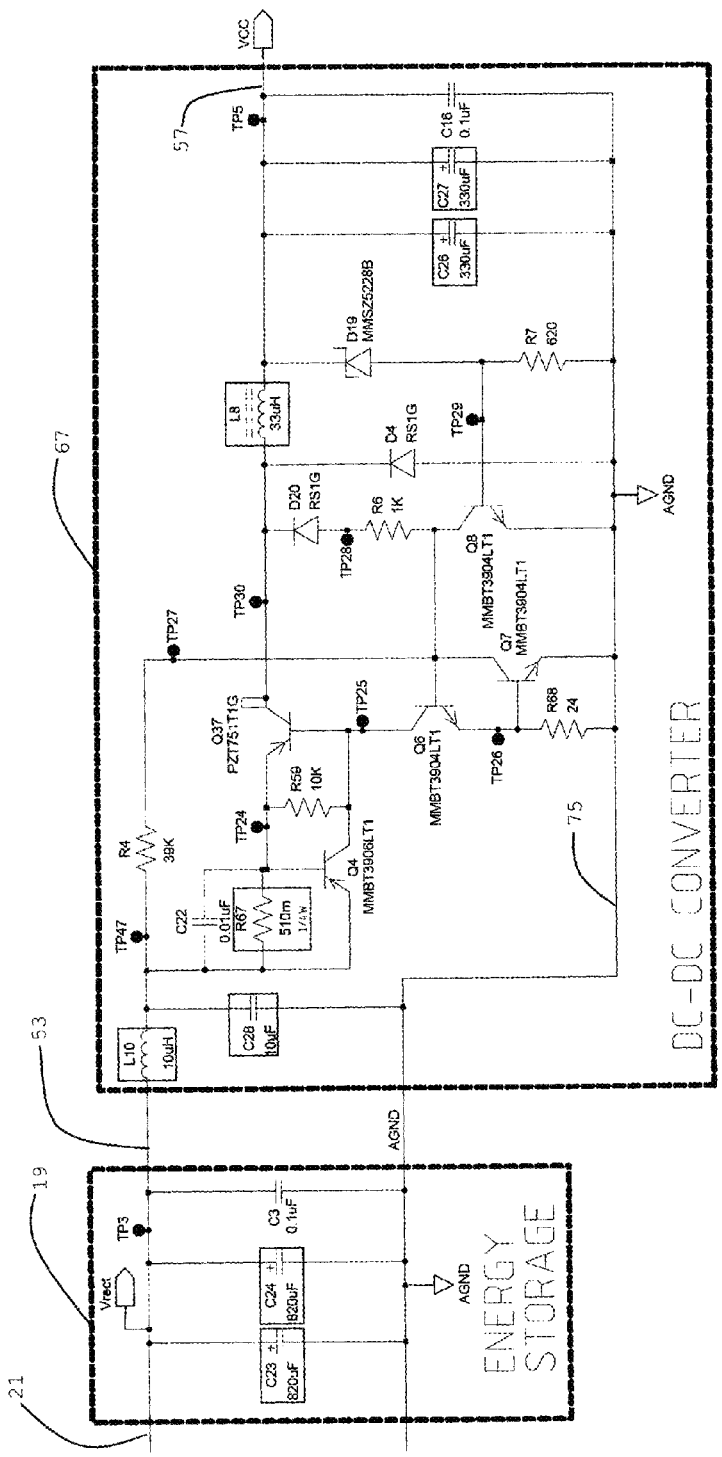
FIG. 19 is a diagram of an energy storage module and a DC-DC converter.

Power supply unit 91 of the high power version may be essentially the same as power supply unit 81 of the low power version. The following noted Figures may reveal some differences between the units. FIG. 18 is a diagram of a high power version of bypass circuit 18 having an AC-DC converter in lieu of an RC network as shown in FIG. 12. The AC-DC converter may be connected to a crossing signal on connection 62, a voltage connection 53, a line 72 connection from an output of triac 12, an energy output on connection 21 and a ground connection 75. FIG. 19 is a diagram of a DC-DC converter 67 in lieu of the linear regulator of FIG. 11. Converter 67 may have a connection 53 from the energy storage module 19, an output on connection 57 and a ground connection 75.

Figure 20:
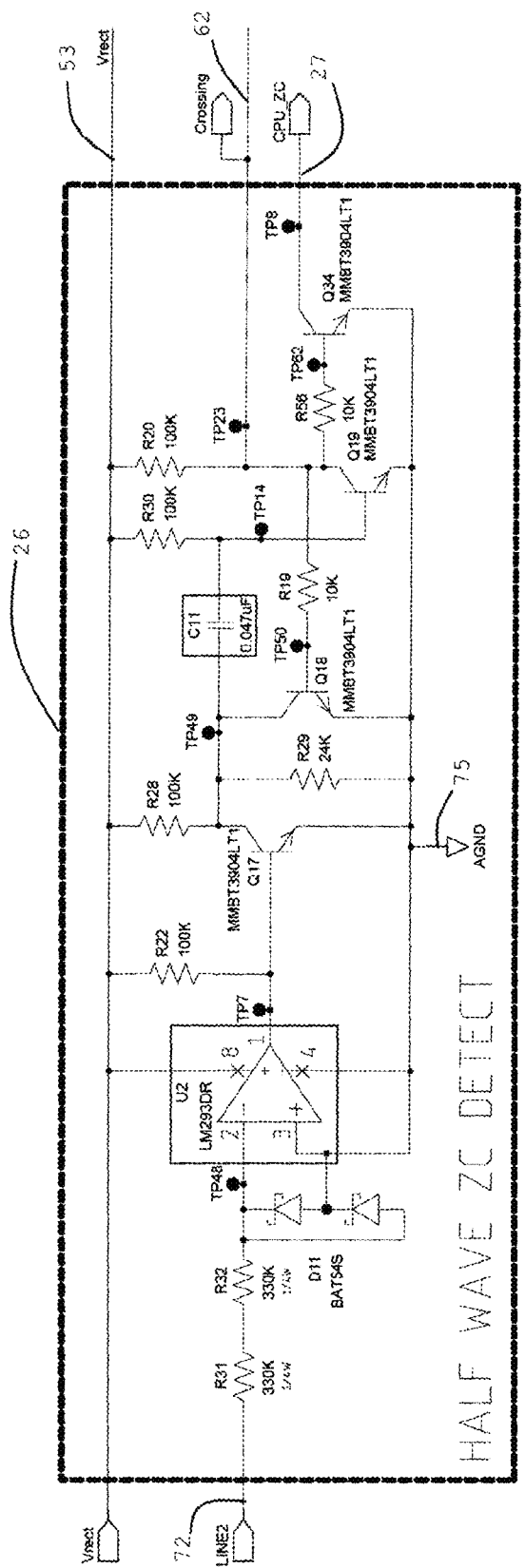
FIG. 20 is diagram of another half wave zero crossing detect circuit.

FIG. 20 is a diagram of a half wave ZC detect circuit 26 for the unit 91 high power version in lieu of circuit 26 of FIG. 13.

The design of circuit 26 in FIG. 20 may be different from circuit 26 in FIG. 13 in that circuit 26 of FIG. 20 is designed to accommodate a line 72 connection. Circuit 26 may have output lines on connection 62 and 27. Circuit 26 may have a voltage connection 53 and a ground connection 75.

Figure 21:
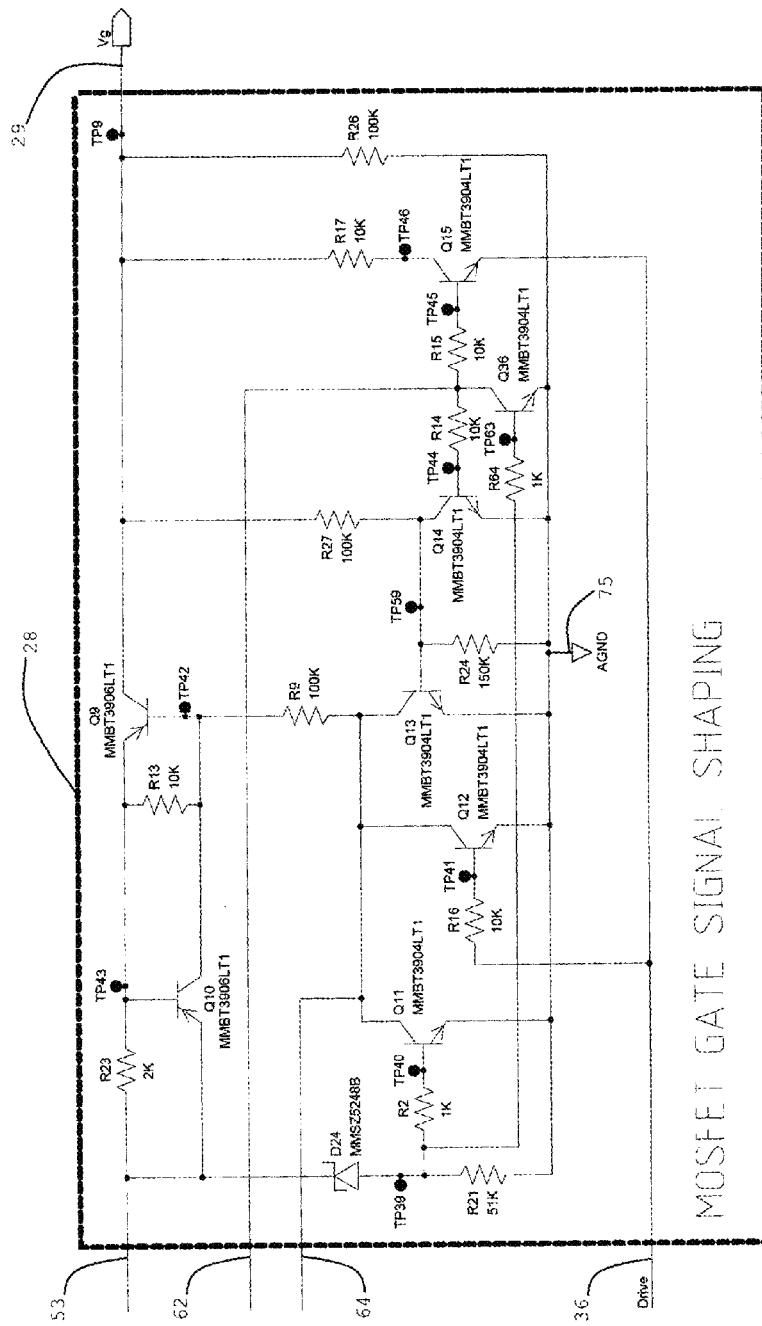
FIG. 21 is a diagram of another gate signal shaping circuit.

FIG. 21 is a diagram of gate shaping signal circuit 28 for the unit 91 high power version in lieu of circuit 28 of FIG. 14. The design of circuit 28 in FIG. 21 may be different from circuit 28 in FIG. 14 in that circuit 28 of FIG. 21 is designed to accommodate a drive signal on connection 36. Circuit 28 may also have input lines on connections 53, 62 and 64. There may also be a gate signal output on connection 29. Circuit 28 may have a ground connection 75.

A thermostat power supply may incorporate a first terminal for connection to a first line of a power source, a triac having a first input connected to the first terminal, a bypass circuit having a first input connected to the first terminal, a stealing circuit having an input connected to an output of the bypass circuit, a power steal module having an input connected to an output of the triac and an output connected to an output of the stealing circuit, a second terminal for connection to a load, a zero crossing detection module having an input connected to the first terminal, and a gate driving circuit having an input connected to an output of the zero crossing detection module, and an output connected to a second input of the power steal module.

The power steal module may be for stealing energy from the first terminal. The stealing circuit may be for storing stolen energy from the power steal module. The power steal module may incorporate one or more MOSFETs that switch on and off for stealing energy. The gate driving circuit may provide gate signals to the one or more MOSFETs for switching the one or more MOSFETs on and off.

The gate driving circuit may shape the gate signals to reduce EMI emissions from the one or more MOSFETs due to switching the one or more MOSFETs on and off. The zero crossing detection module may provide a signal to the gate driving circuit for determining times that the gate signals are to switch the one or more MOSFETs on and off relative to a zero crossing point of a waveform on the first line of the power source.

A power unit may incorporate a first terminal for connection to a power source, a triggerable switch having an input connected to the first terminal, a bypass circuit having an input connected to the first terminal, a storage having an input connected to an output of the bypass circuit, a power steal module having an input connected to an output of the triggerable switch and having an output connectable to a second terminal, a second terminal for connection to a load connected to the power source, a zero crossing detector having an input connected to the first terminal, and a gate driving circuit having an input connected to the zero crossing detector, and having an output connected to the power steal module.

The power steal module may incorporate one or more transistors that switch on and off to let current flow as deemed to the second terminal. The gate driving circuit may provide signals to the one or more transistors that switch on and off according to the signals which are adjusted in shape to result in the switch on and off of current to obtain minimized EMI emissions from switched current. The minimized EMI emissions are to comply with applicable government regulations. The one or more transistors may be MOSFETs.

The power steal module and/or gate driving circuit may further incorporate MOSFETs as the one or more transistors, one or more current limiting devices to control a rate of charge and discharge of one or more gates of the MOSFETs, and latching circuitry enabled by a voltage level detector to keep a state of the MOSFETs from a previous power steal to a subsequent power steal.

The unit may further incorporate a MOSFET wave protection module having an input connected to the first terminal and an output connected to an input of the gate signal generator. The gate signal generator may provide the signals to the one or more transistors according to timing derived from the zero crossing detector.

A thermostat power system may incorporate a first terminal for connection to a power supply and load arrangement, a second terminal for connection to the power supply and load arrangement, a triggerable switch, having an input, connected to the first terminal, a bypass circuit having an input connected to the first terminal, an energy storage module having an input connected to an output of the bypass circuit, a power steal module having an input connected to an output of the triggerable switch, and a driving circuit for a control signal having an output connected to a second input of the power steal module. The control signal may minimize EMI emissions from the power steal module.

The system may further incorporate a wave zero crossing detector having an input connected to the first terminal and an output connected to an input of the driving circuit.

The control signal from the driving circuit may goes to a gate of one or more transistors to turn on or off the one or more transistors to steal power. The turn on or off of the transistors may cause EMI emissions. The driving circuit adjusts a shape of the control signal to turn on or off the transistors in a manner to minimize EMI emissions. The one or more transistors may be MOSFETs.

The driving circuit may provide a control signal that is timed according to a signal from the wave zero crossing detector to turn on or off the transistors in a manner to minimize EMI emissions.

The triggerable switch may be selected from a group consisting of a triac, an SCR and a relay.

The system may further incorporate a reverse wave protection module having an input connected to the first terminal and an output connected to a second input of the driving circuit.

A power supply unit for a heating, ventilation and air conditioning thermostat, may incorporate a first terminal for connection to a line of a power source, a second terminal for connection to a load, a bypass circuit having an input connected to the first terminal, a triac having an input connected to the first terminal, a stealing circuit having an input connected to an output of the bypass circuit and having an output connected to the second terminal, a power steal module having an input connected to an output of the triac, and a trigger circuit having an output connected to a second input of the triac.

The unit may further incorporate a zero crossing detection circuit having an input connected to the first terminal and an output connected to an input of the trigger circuit.

The unit may further incorporate a zero crossing detection circuit having an input connected to the first terminal, and an interface circuit having an input connected to an output of the zero crossing detection circuit and having an output connected to an input of the trigger circuit.

A second output of the stealing circuit may be connected to a second input of the trigger circuit. An output of the trigger circuit may be connected to a second input of the triac. The stealing circuit may incorporate energy storage. Stored energy may go from the second output of the stealing circuit to the second input of the triac.

A zero crossing signal may go from the zero crossing detection circuit to the input of the interface circuit. A zero crossing drive signal may go from the output of the interface circuit to the input of the trigger circuit.

The zero crossing detection circuit may incorporate a half wave zero crossing detector. The trigger circuit may incorporate a DC-DC negative current source having an input connected to the second output of the stealing circuit, and a triac gate triggering signal circuit having an input connected to an output of the DC-DC negative current source.

The unit may further incorporate a DC-DC converter connected to the second output of the stealing circuit. The bypass circuit may incorporate an AC-DC converter.

The unit may further incorporate a linear regulator connected to the second output of the stealing circuit. The bypass circuit may incorporate an RC network.

A power system for thermostats, may incorporate a first terminal connected to a line of a power supply, a bypass circuit having an input connected to the first terminal, a triggerable switch having an input connected to the first terminal, a power steal module having an input connected to an output of the bypass circuit, a zero crossover detector having an input connected to an output of the bypass circuit, a energy storage module having an input connected to an output of the power steal module, and a trigger circuit having an input connected to an output of a zero crossover detector and having an output connected to a second input of the triggerable switch.

The trigger circuit may incorporate a processor. The processor may have an input connected to the output of the zero crossover detector and an output connected to the second input of the triggerable switch. The processor may determine a drive signal for the triggerable switch from a zero crossing signal of the output of the zero crossover detector and from a set of instructions.

Power may be taken from the energy storage module and used to trigger the triggerable switch near a zero crossing of energy on the line of the power supply as effected by the processor and a line pattern according to a working quadrant of the triggerable switch.

The system may further incorporate a gate signal shaper having an input connected to an output of the zero crossover detector and having an output connected to the power steal module. The power steal module may incorporate one or more MOSFETs.

An output of the gate signal shaper may be a gate signal having a shape that switches the one or more MOSFETs on or off in a manner to minimize EMI emissions from switching stolen power by the one or more MOSFETs.

The system may further incorporate a MOSFET reverse wave protection circuit having an input connected to the first terminal and an output connected to a second input of the gate signal shaper.

The power steal module may steal power from the first terminal or an output of the bypass circuit. The power steal module may provide stolen power to the energy storage module.

A thermostat power system may incorporate a triggerable switch having an input connected to a first terminal, a bypass circuit having an input connected to the first terminal, an energy storage module having an input connected to an output of the bypass circuit and an output connected to a second terminal, a power steal circuit having an input connected to an output of the triggerable switch, and an active trigger module having an input connected to an output of a wave position detector, having an output connected to the triggerable switch, and having an input connected to a second output of the energy storage module. The first terminal and second terminal may be for connection to an AC power line and load arrangement.

The power steal circuit may incorporate transistors. A trig signal may be sent at certain times, according to information at the output of the wave position detector, from the output of the active trigger module to a second input of the triggerable switch. A signal from the output of the triggerable switch to the input of the power steal circuit may turn the transistors on or off. The active trigger module may take energy at the second input from the second output of the energy storage to trigger the triggerable switch near a zero crossing of the power line when energy directly from the power line is insufficient to trigger the triggerable switch.

A power supply unit for a heat, ventilation and air conditioning thermostat, may incorporate a triac having an input, a gate and an output, a bypass circuit having an input connected to the input of the triac, a stealing circuit having an input connected to an output of the bypass circuit, and a MOSFET power steal module having an input connected to the output of the triac. The input of the triac and an output of the MOSFET power steal module may be primary terminals for connection in a power circuit.

The power circuit may incorporate a power source connected in series with an electrical load. The electrical load may be an electric heating mechanism.

The stealing circuit may incorporate an energy storage module. The MOSFET power steal module may steal energy and the energy may go to the energy storage module. The energy may be used to trigger the triac at a zero crossing of line voltage from the power source.

The unit may further incorporate a gate signal shaper connected to the MOSFET power steal module. The gate signal shaper may provide a gate signal that results in a soft transition of turning on and off of the MOSFETs.

The unit may further incorporate a half wave zero cross detect module connected to the line voltage, to a gate signal shaper, and to a triac gate triggering module.

Power supply electronics for a thermostat, may incorporate a first terminal for connection to a first line of a power source, a bypass circuit having an input connected to the first terminal, a triac having an input connected to the first terminal, a second terminal for connection to a load, a stealing circuit having an input connected to an output of the bypass circuit and an output connected to the second terminal, and a power steal module having an input connected to the output of the triac and an output connected to the second terminal.

The power steal module may incorporate one or more MOSFETs that are switched on to steal power. The stealing circuit may incorporate an energy storage unit. Stolen power goes to the energy storage unit.

The bypass circuit may incorporate an RC network, or an AC-DC converter.

The electronics may further incorporate a linear regulator and a super capacitor connected to an output of the energy storage unit.

The electronics may further incorporate a DC-DC converter connected to an output of the energy storage unit.

If the power steal module incorporates two or more MOSFETs, then a serial MOSFETs power stealing approach may be effected.

A thermostatic power supply may incorporate a bypass circuit, a first terminal for connection to a power source, a second terminal for connection to a load, a bypass circuit having an input connected to the first terminal, an energy storage module having an input connected to the bypass circuit and an output connected to the second terminal, a triggerable switch having an input connected to the first terminal, and a power steal module having an input connected to an output of the triggerable switch and an output connected to the second terminal.

The supply may further incorporate a DC-DC converter having an input connected to the output of the energy storage module. The bypass circuit may incorporate an AC-DC converter.

The supply may further incorporate a linear regulator having an input connected to the output of the energy storage module. The bypass circuit may incorporate an RC network.

The supply may further incorporate a super capacitor connected to the linear regulator. The triggerable switch may be selected from a group consisting of a triac, SCR and a relay. The power steal module may incorporate one or more switching MOSFETs.

In the present specification, some of the matter may be of a hypothetical or prophetic nature although stated in another manner or tense.

Although the present system and/or approach has been described with respect to at least one illustrative example, many variations and modifications will become apparent to those skilled in the art upon reading the specification. It is therefore the intention that the appended claims be interpreted as broadly as possible in view of the related art to include all such variations and modifications.

What is claimed is:

1. A thermostat power supply comprising:
a first terminal for connection to a first line of a power source;
a triac having a first input connected to the first terminal;
a bypass circuit having a first input connected to the first terminal;
a stealing circuit having an input connected to an output of the bypass circuit;
a power steal module having an input connected to an output of the triac and an output connected to an output of the stealing circuit;
a second terminal for connection to a load;
a zero crossing detection module having an input connected to the first terminal; and
a gate driving circuit having an input connected to an output of the zero crossing detection module, and an output connected to a second input of the power steal module.

2. The power supply of claim 1, wherein:
the power steal module is for stealing energy from the first terminal; and
the stealing circuit is for storing stolen energy from the power steal module.

3. The power supply of claim 2 wherein the power steal module comprises one or more MOSFETs that switch on and off for stealing energy.

4. The power supply of claim 3, wherein the gate driving circuit provides gate signals to the one or more MOSFETs for switching the one or more MOSFETs on and off.

5. The power supply of claim 4, wherein the gate driving circuit shapes the gate signals to reduce EMI emissions from the one or more MOSFETs due to switching the one or more MOSFETs on and off.

6. The power supply of claim 3, wherein the zero crossing detection module provides a signal to the gate driving circuit for determining times that the gate signals are to switch the one or more MOSFETs on and off relative to a zero crossing point of a waveform on the first line of the power source.

7. A power unit comprising:
a first terminal for connection to a power source;
a triggerable switch having an input connected to the first terminal;
a bypass circuit having an input connected to the first terminal;
a storage having an input connected to an output of the bypass circuit;
a power steal module having an input connected to an output of the triggerable switch and having an output connectable to a second terminal;
a second terminal for connection to a load connected to the power source;
a zero crossing detector having an input connected to the first terminal; and
a gate driving circuit having an input connected to the zero crossing detector, and having an output connected to the power steal module.

8. The unit of claim 7, wherein:
the power steal module comprises one or more transistors that switch on and off to let current flow as deemed to the second terminal; and
the gate driving circuit provides signals to the one or more transistors that switch on and off according to the signals which are adjusted in shape to result in the switch on and off of current to obtain minimized EMI emissions from switched current.

9. The unit of claim 8, wherein the one or more transistors are MOSFETs.

10. The unit of claim 8, wherein the minimized EMI emissions comply with applicable government regulations.

11. The unit of claim 8, wherein the power steal module and/or gate driving circuit further comprises:
MOSFETs as the one or more transistors;
one or more current limiting devices to control a rate of charge and discharge of one or more gates of the MOSFETs; and
latching circuitry enabled by a voltage level detector to keep a state of the MOSFETs from a previous power steal to a subsequent power steal.

12. The unit of claim 7, further comprising a MOSFET wave protection module having an input connected to the first terminal and an output connected to an input of the gate signal generator.

13. The unit of claim 8, wherein the gate signal generator provides the signals to the one or more transistors according to timing derived from the zero crossing detector.

14. A thermostat power system comprising:
a first terminal for connection to a power supply and load arrangement;
a second terminal for connection to the power supply and load arrangement;
a triggerable switch, having an input, connected to the first terminal;
a bypass circuit having an input connected to the first terminal;
an energy storage module having an input connected to an output of the bypass circuit;
a power steal module having an input connected to an output of the triggerable switch; and
a driving circuit for a control signal having an output connected to a second input of the power steal module; and
wherein the control signal minimizes EMI emissions from the power steal module.

15. The system of claim 14, further comprising a wave zero crossing detector having an input connected to the first terminal and an output connected to an input of the driving circuit.

16. The system of claim 14 wherein:
the control signal from the driving circuit goes to a gate of one or more transistors to turn on or off the one or more transistors to steal power;
the turn on or off of the transistors can cause EMI emissions; and
the driving circuit adjusts a shape of the control signal to turn on or off the transistors in a manner to minimize EMI emissions.

17. The system of claim 16, wherein the one or more transistors are MOSFETs.

18. The system of claim 16, wherein the driving circuit provides a control signal that is timed according to a signal from the wave zero crossing detector to turn on or off the transistors in a manner to minimize EMI emissions.

19. The system of claim 14, the triggerable switch may be selected from a group consisting of a triac, an SCR and a relay.

20. The system of claim 14, further comprising a reverse wave protection module having an input connected to the first terminal and an output connected to a second input of the driving circuit.

* * * * *